(12) United States Patent
Young (10) Patent No.: US 9,191,062 B2
(45) Date of Patent: Nov. 17, 2015

(54) SIGNAL DETECTION IN NOISE

(75) Inventor: Philip Young, Northampton (GB)

(73) Assignee: enModus Limited, Monmouthshire (GB)

( * ) Notice: Subject to any disclaimer, the term of this patent is extended or adjusted under 35 U.S.C. 154(b) by 5 days.

(21) Appl. No.: 13/993,514

(22) PCT Filed: Dec. 21, 2011

(86) PCT No.: PCT/GB2011/052548
§ 371 (c)(1),
(2), (4) Date: Jun. 12, 2013

(87) PCT Pub. No.: WO2012/085573
PCT Pub. Date: Jun. 28, 2012

(65) Prior Publication Data
US 2013/0266043 A1   Oct. 10, 2013

(30) Foreign Application Priority Data

Dec. 24, 2010  (GB) .................................. 1021997.0

(51) Int. Cl.
| | | |
|---|---|---|
| *H04B 1/7097* | (2011.01) | |
| *H03M 13/09* | (2006.01) | |
| *H04B 1/7073* | (2011.01) | |
| *H04L 1/00* | (2006.01) | |
| *H04L 1/20* | (2006.01) | |

(52) U.S. Cl.
CPC ............. *H04B 1/7097* (2013.01); *H03M 13/09* (2013.01); *H04B 1/7073* (2013.01); *H04L 1/0046* (2013.01); *H04L 1/0061* (2013.01); *H04L 1/206* (2013.01)

(58) Field of Classification Search
CPC ... H03M 13/09; H04B 1/7073; H04B 1/7097; H04L 1/0061; H04L 1/206; H04L 1/0046
USPC .......................... 375/316, 355, 354, 144, 142
See application file for complete search history.

(56) References Cited

U.S. PATENT DOCUMENTS

| | | | |
|---|---|---|---|
| 5,067,136 A * | 11/1991 | Arthur et al. ................... | 375/142 |
| 5,852,630 A * | 12/1998 | Langberg et al. .............. | 375/219 |
| 5,999,561 A * | 12/1999 | Naden et al. ................... | 375/142 |
| 6,266,360 B1 * | 7/2001 | Okamoto ....................... | 375/140 |
| 6,628,699 B2 * | 9/2003 | Ramberg et al. .............. | 375/148 |
| 6,707,843 B2 * | 3/2004 | Norman et al. ................ | 375/144 |
| 6,728,301 B1 | 4/2004 | Chrisikos | |
| 6,990,141 B1 | 1/2006 | Iwasaki | |

(Continued)

FOREIGN PATENT DOCUMENTS

| | | |
|---|---|---|
| JP | 63177070 | 7/1988 |
| JP | 2002-185363 | 6/2002 |

(Continued)

*Primary Examiner* — Shuwang Liu
*Assistant Examiner* — Helene Tayong
(74) *Attorney, Agent, or Firm* — Wood, Phillips, Katz, Clark & Mortimer (57) ABSTRACT

A method of detecting a transmission. The method includes: measuring, from a first portion of a received spread-spectrum signal, a first code-phase of a spreading-code; measuring, from a second portion of the signal, a second code-phase of the spreading-code; comparing the first and second code-phases; and detecting whether the transmission is present according to the result of the comparison. Also disclosed are corresponding methods and apparatus for transmission and reception of signals.

11 Claims, 11 Drawing Sheets

(56) References Cited

U.S. PATENT DOCUMENTS

| | | | | |
|---|---|---|---|---|
| 7,835,475 | B2 * | 11/2010 | Adachi | 375/343 |
| 8,035,557 | B2 * | 10/2011 | Thomson et al. | 342/357.59 |
| 2005/0063363 | A1 * | 3/2005 | Lazar et al. | 370/352 |
| 2007/0104252 | A1 | 5/2007 | Jang | |
| 2007/0274405 | A1 | 11/2007 | Adachi | |

FOREIGN PATENT DOCUMENTS

| | | |
|---|---|---|
| JP | 2001-94468 | 10/2002 |
| JP | 2002-16528 | 11/2002 |
| JP | 2002-118498 | 11/2003 |
| JP | 2004-531137 | 10/2004 |
| JP | 2005-500737 | 1/2005 |
| SG | 143082 | 6/2008 |
| WO | WO 01/45288 | 6/2001 |
| WO | WO 02/093296 | 11/2002 |
| WO | WO 03/017551 | 2/2003 |
| WO | WO 2010/036053 | 4/2010 |

* cited by examiner

SIGNAL DETECTION IN NOISE

This invention relates to a method and apparatus for enhancing the detection of a signal in noise, and to a method and apparatus for transmitting a signal so as to support this enhanced detection. It is particularly relevant to spread spectrum communications, in which a low-rate data signal is modulated onto a high-rate spreading code (or "chipping" code), which spreads the signal's energy across a broad bandwidth.

It is well known that the use of spreading codes can improve noise immunity and such techniques have been used in wireless telecommunications for many years. In particular, it is known to use the same spreading code for transmitting multiple channels by using different phase-offsets of the spreading code. This is possible because the cross-correlation between shifted versions of the same spreading code is nominally low. This principle is applied in Code Division Multiple Access (CDMA) and Wideband CDMA (WCDMA), for example.

According to an aspect of the invention, there is provided a method of detecting a transmission, the method comprising:

measuring, from a first portion of a received spread-spectrum signal, a first code-phase of a spreading-code;

measuring, from a second portion of the signal, a second code-phase of the spreading-code;

comparing the first and second code-phases; and detecting whether the transmission is present according to the result of the comparison.

In the step of detecting whether the transmission is present, the signal is preferably rejected if the result of the comparison shows that the first and second code-phases do not satisfy a predefined relationship.

Here, "rejected" means that it is determined that the signal consists solely of unwanted interference (noise). That is, it is determined that the transmission is not present. Therefore, no further analysis of the signal is performed—in particular, there is no attempt to demodulate a corresponding symbol.

The transmission will typically comprise a sequence of symbols. The first portion will then correspond to the duration of an expected first symbol and the second portion will correspond to the duration of an expected second symbol. Here, correspondence means that a coherent integration period which is used to measure the code-phase is contained within one symbol period. Preferably, the code-phase is measured over the entire symbol period of the symbol concerned—that is, the integration period is chosen so that it matches the symbol period (approximately, based on the expected arrival time of the symbol). Each symbol can represent one or more information bits, as is conventional.

The sequence of symbols makes up a data message or packet. When a signal is rejected, at least one symbol is rejected (discarded or ignored). Optionally, two or more symbols may be rejected. More preferably, the entire sequence of symbols forming the packet is rejected.

The transmission is an expected transmitted signal, which may or may not be present in the received signal. It is assumed that the first and second symbols are transmitted with a predefined phase relationship that is known to the receiver. For example, they may preferably be transmitted using the same phase. Comparing the phases of the two signal portions corresponding to the expected first and second symbols therefore allows the transmission to be detected reliably. If the signal is present, the predefined phase relationship will be recognised at the receiver. If the transmitted signal is not present, the method will measure the phase of first and second portions of noise. The probability that these segments of noise obey the same phase relationship is extremely low. Therefore, it is possible to reliably reject received signals which consist solely of noise.

Measuring each of the first and second code-phases typically comprises correlating the received signal with a local copy of the spreading code (that is, calculating a correlation function between the known spreading code and the received signal) and determining the code-phase of the peak of the correlation function.

The present method of analysing the phase relationship of (expected) symbols can be more robust than analysing signal amplitude (or power) and attempting to discriminate between valid signals and noise on the basis of a threshold. The noise power may be very similar to the level of the desired signal, making it difficult to distinguish between the two on the basis of amplitude. At the same time, it may be easy to distinguish the signal from noise on the basis of phase (alone). For even greater robustness, the phase relationships among more than two symbols can be verified. With each additional symbol analysed, the probability of a false positive (wherein noise mimics the predefined phase relationship of the desired transmitted signal) drops still further.

The step of detecting whether the transmission is present optionally comprises determining whether the first and second code-phases match one another, the code-phases preferably being determined to match if a difference between them is less than a predefined threshold.

The method may further comprise determining whether the detected transmission is a desired one among a plurality of signals, wherein each of the plurality of signals comprises a message encoded with a specific, different error-detecting code, the method comprising, upon detecting that the transmission is present: attempting to validate the message using the specific code associated with the desired signal; and determining that the detected transmission is the desired one if the validation is successful.

The method may comprise receiving the signal from one of a number of transmitters, wherein a signal from another one of the transmitters may interfere with reception of the desired signal.

Here, the use of a different error-detecting code for each signal allows a receiver to disambiguate between the desired signal and at least one other (unwanted) signal which could accidentally be received in its place. This technique guards against the possibility that the receiver detects a different signal and mistakes it for the desired signal—for example, because of a timing- or phase-offset or error between the transmitter and receiver. The other (unwanted) signal can be seen as coherent noise, interfering with the reception of the desired signal.

In this way, each signal is characterized by and may be identified by the choice of error-detecting code. In other communications schemes, signals from different transmitters are conventionally identified by a header part of the message. The present method is simpler and more efficient, since the source of the signal can be unambiguously identified without the need for a header. A header can add significant overhead, particularly when the packet (e.g. message) size is small. The present method is therefore particularly advantageous for a communications network having many transmitters and a small packet payload.

The method may comprise detecting at least two transmitted signals, followed by attempting to validate the respective messages using the two different codes associated with the respective desired signals; and in each case, determining that the detected transmission is the desired one if the validation is successful.

Here, "different" error-detecting codes means processes which, if they were supplied with the same input message-data, would produce different output code-words. The code-words produced by the processes should also be distinct, in the sense that a codeword produced by one process (code) should not be identical to any valid code-word that could be produced by the other process. This means that, for each code-word transmitted, it will only possible to successfully validate or decode the codeword using one process (that which corresponds to the encoding process). Thus, the process used to encode the message and the resulting codeword is distinctive of the source of the transmission and can be used to filter the transmissions.

Encoding a message with a specific error-detecting code may comprise encoding the message with a generic code, common to the plurality of signals, in order to incorporate a plurality of check-bits in the message, followed by modifying the encoded message in a specific (unique) way. The step of attempting to validate the message may then comprise undoing or reversing the specific modification; extracting from the signal the plurality of check bits; and validating the check bits, according to the common error-detecting code. Modification of a generic code to produce a specific code may comprise seeding the generic code using a different (unique) numerical seed value.

Preferably, a part of the message altered by the specific modification comprises at least one (and preferably more than one) of the check bits. This is because if only data bits are modified, more care is needed to ensure that it is not possible to successfully decode/validate the message at the receiver, by using a different error-detecting code. In contrast, if the check bits are modified, then it is guaranteed that the message will be invalidated for all codes except the specific error-detecting code associated with the transmission.

Each error-detecting code may define a plurality of check bits in the message, the specific code for each signal being defined by a specific number which is added to the check bits before the signal is transmitted, and wherein the step of attempting to validate the message comprises: extracting from the signal the plurality of check bits; subtracting from the check bits the specific number associated with the desired signal; and validating the check bits that result from the subtraction, according to the error-detecting code.

The specific number added before transmission, and later subtracted after reception, may be positive or negative.

Here, the channel code used for each transmission is characterised by a set of check-bits added to the message, which are common across all transmissions; and a modification applied to this common set of check bits, which is specific to each individual transmission. To decode or validate the message, the specific inverse modification is applied to the received check bits, before decoding or validating the check bits in the normal way. This is a convenient way of providing a different, customised channel-code for each transmission. The hardware and software of each transmitter can thus be almost identical—the only aspect that needs to be configured is the specific algorithm used to modify the common channel-code. Likewise, at the receiver, different transmissions can be validated simply by changing the specific inverse modification in each case.

The error-detecting code preferably comprises a Cyclic Redundancy Check, CRC.

This provides one robust and efficient way to define the error-detecting code.

According to a related aspect of the invention, there is provided a method of transmitting a plurality of signals, each signal comprising a respective data message, the method comprising:

encoding each data message with a different error-detecting code, whereby a receiver can distinguish among the different signals by the different error-detecting codes with which it is possible to validate them.

Each signal may be transmitted with a different code-phase.

The receiver can thus distinguish between messages transmitted with different code-phases when a phase-offset or cross-correlation effect means that the signals can no longer be distinguished by their phases alone. The plurality of signals may be transmitted concurrently—that is, in partially or completely overlapping time-windows. Each signal may comprise a sequence of symbols. Each symbol in the sequence is transmitted with the same phase (or a predefined phase relationship).

The signal is preferably a spread-spectrum signal and the phase is preferably a code-phase of a spreading-code.

Further optional features of methods of encoding the data message with a unique error-detecting code are as summarised previously above.

The methods above have been found to be particularly advantageous in the context of spread spectrum communications. Spread spectrum signals are usually de-spread by correlating the received signal with a copy of the spreading code and detecting a peak in the resulting correlation function. However, in this case an amplitude threshold must be set, to decide if the peak is high enough (that is, if there is strong enough correlation). In the present method, the timing (that is, the code phase) of the peak is studied instead. The positions of the peaks for two symbols are compared—if they match, detection of a transmitted signal is declared; if they do not match, noise (the absence of a transmitted signal) is declared.

Also provided is a computer program comprising computer program code means adapted to perform all the steps of any preceding claim if said program is run on a computer, and such a computer program embodied on a computer readable medium.

According to another aspect of the invention there is provided a receiver operable to detect a transmission, the receiver comprising:

a correlator, adapted to measure a first code-phase of a spreading-code of a first portion of a received spread-spectrum signal;

a correlator, adapted to measure a second code-phase of a spreading-code of a second portion of the signal;

a comparator, adapted to compare the first and second code-phases; and a detector, operable to detect whether the transmission is present according to the result of the comparison.

The receiver may further comprise: a decoder, operable to determine whether the detected transmission is a desired one among a plurality of signals, wherein each of the plurality of signals comprises a message encoded with a specific, different error-detecting code, the decoder comprising a code validator, adapted to: attempt to validate the message using the specific code associated with the desired signal; and determine that the detected transmission is the desired one if the validation is successful.

Also provided is a transmitter, for transmitting one of a plurality of signals, each signal comprising a respective data message, the transmitter comprising:

an input, for receiving an indication of an assigned error-detecting code to be used by the transmitter; and an encoder, adapted to encode the data message using the assigned code, whereby a receiver can distinguish among the plurality of signals by the different error-detecting codes with which it is possible to validate them.

The transmitter or receiver may be adapted to communicate over a power-line communications network.

Preferably the power-line transmissions from different transmitters are allocated discrete time-slots and/or code-phases. That is, the network uses time-division and/or code-division multiplexing to accommodate multiple transmissions.

The present methods and apparatus are particularly well suited to use in power-line communications. Here path length between the transmitter and receiver may be negligible or predictable, meaning that it is attractive to use time and/or phase to differentiate transmissions. Furthermore, multi-path reflections are not likely to be a significant problem (unlike in free-space radio frequency communications). The presently disclosed techniques are particularly useful for discriminating between multiple signals in such an environment, because they can resolve potential timing/phase ambiguities simply and effectively.

The transmitter or receiver may be adapted to determine the timing or phase of a transmitted or received symbol relative to a timing-reference signal broadcast in the power-line communications network.

The use of the common timing-reference signal removes much uncertainty in the timing (and phase) of transmission and reception of signals in the network. This makes the signal detection and validation strategies outlined above effective and efficient, because the transmitter and receiver are substantially synchronised. The receiver knows approximately when the transmitter will transmit the signal; it merely needs to establish whether or not the transmitter has done so. It also needs to resolve (within a small window of remaining uncertainty) whether an observed signal is the desired signal from a given transmitter (respectively, in a given channel) or is a phantom signal from a neighbouring channel.

The invention will now be described by way of example with reference to the accompanying drawings, in which.

It should be noted that these figures are diagrammatic and not necessarily drawn to scale. Relative dimensions and proportions of parts of these figures have been shown exaggerated or reduced in size, for the sake of clarity and convenience in the drawings.

The following description explains an embodiment of the invention in the context of a power-line communications network. In particular, GB Patent Application No. 1010728.2, filed 25 Jun. 2010, discloses a power-line communications network in which (potentially many) low cost nodes monitor the power consumption of mains-powered electrically operated equipment and communicate this information to a centralized aggregator using mains borne communications methods. The aggregator is a master device, which in addition to receiving power-consumption data from the nodes, coordinates the communications in the network. Each node may be identical, but is configurable by the aggregator to use one of a number of (logical) channels in a multiple-access system.

Figure 1:
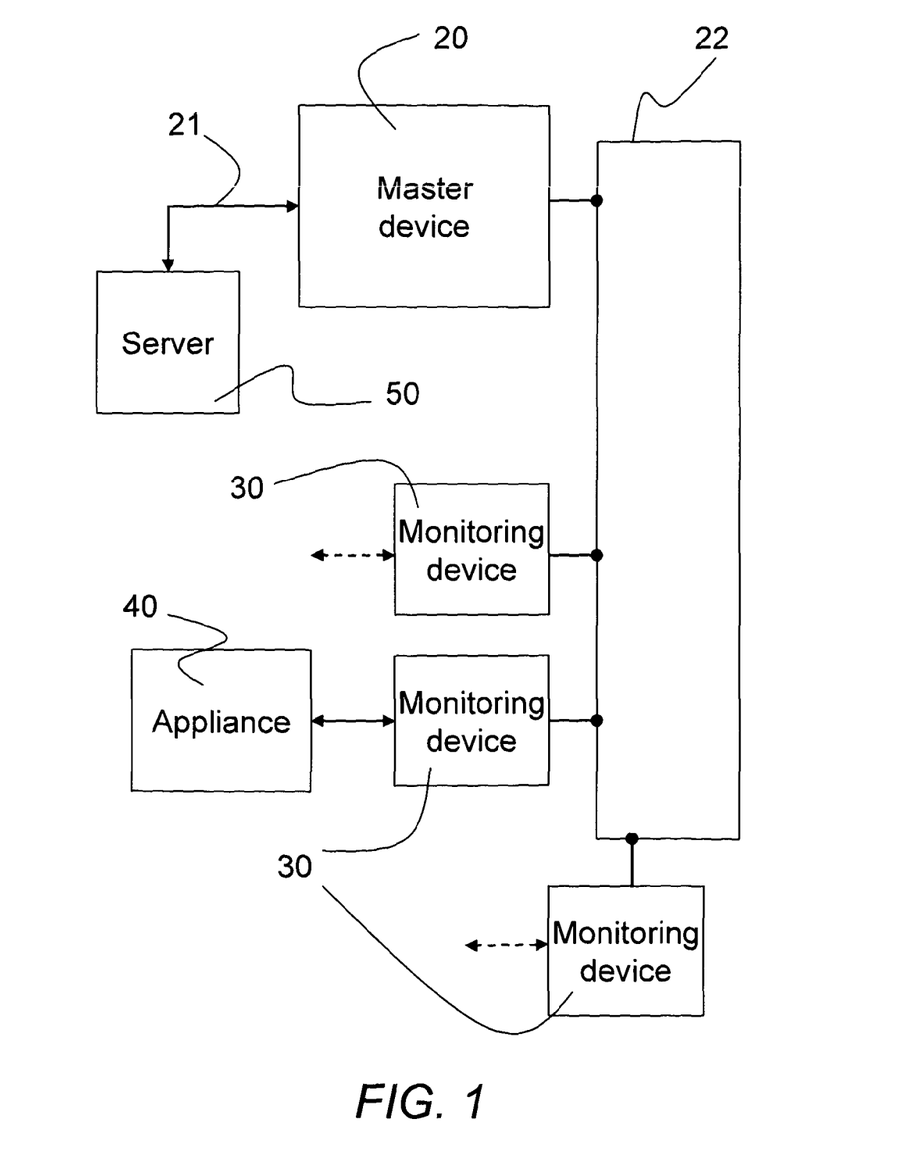
FIG. 1 is a block diagram of a power-line communications network.

FIG. 1 shows an example of a network according to GB 1010728.2. A master (aggregator) device 20 and three remote monitoring devices (nodes) 30 are connected to a mains electrical circuit 22, which is a ring main. An appliance 40, whose power consumption is to be monitored, is connected to a monitoring device 30. In this example, the appliance is also connected to the mains power supply 22 through the monitoring device 30. The master device 20 configures each monitoring device 30 as it is connected to the network. Once configured, each monitoring device 30 transmits measurements intermittently at regular intervals. These measurements are received by the aggregator 20 and forwarded to a server 50, over an internet connection 21.

The communications protocol used is designed to remain robust in the presence of short-duration wideband noise bursts. The architecture addresses this issue by using spread-spectrum techniques, whereby a number of nodes can transmit simultaneously at a much slower data rate, such that the typical noise duration is considerably shorter than the symbol duration. In this way it is possible to constrain these interference bursts such that they interfere typically with a single symbol and can therefore be overcome with error correcting codes.

To keep the protocol as efficient, simple and cheap to implement as possible, dynamic arbitration is avoided. This is achieved by using a master timing reference, transmitted by the aggregator, which provides a bounded timing-uncertainty on all nodes. The timing reference signal uses spreading codes.

Using a spreading code transmitted from a master device, timing-uncertainty of much less that 1 microsecond can be achieved in a typical residential building. The largest part of this uncertainty is due to the time taken for the signal to traverse the mains wiring. Typically the signal propagation in mains wiring will be around 0.6 C, or 200 meters/microsecond.

In one embodiment of the power-consumption monitoring network, a code of 128 chips duration is transmitted at 6 Khz. This repeats roughly every 20 ms, whereas a data frame may take several hundred ms to complete. Consequently, the code is transmitted repeatedly, modulated with an additional frame-timing marker signal, which is used to resolve the frame timing ambiguity.

When each node is activated for the first time, it must search all possible phases of the spreading code in order to detect it, and then typically will track the spreading code phase using multiple correlator fingers.

The master timing signal is also used to carry configuration information, to configure each new node as it joins the network. When a node is connected for the first time, it will enter a discovery and configuration mode. Once configured, it will then enter the general communications mode whereby the arbitration is implicit from the system's frame timing marker and the information saved during the configuration process.

The time-division access to the medium is combined with CDMA access techniques such that at any time a subset of the nodes in the system are simultaneously transmitting data using spread spectrum techniques.

At the start of reception of a frame the aggregator must first search for the spreading code of each node. To minimize complexity, nodes will transmit at the same time using the same spreading code, which will be phase shifted for each transmitting node so that the energy from each node will appear within different non-overlapping code phase windows at the output of a correlator in the aggregator.

The protocol described in GB 1010728.2 can work reliably provided that the relative carrier frequencies of the node and aggregator are sufficiently well synchronised. The main source of uncertainty is that of the internal clock in each node. Provided the node's clock is relatively accurate, a small phase-rotation will be observed for each data symbol due to the clock discrepancies. This should be sufficiently constrained that the phase-rotation due to the clock is insignificant over a symbol period. In one example, each node has an accurate time reference derived from the received spreading code and can use this to correct clock errors if a very low-cost clock is used. This leaves the problem of maintaining the code-phase, which is solved by re-aligning at the start of each data frame. The system is therefore tolerant to significant clock drift during a frame period.

The remaining phase-uncertainty in the correlator is attributable to the noise power, which will be dominated by the other CDMA channels (corresponding to other nodes) transmitting power in the same frequency band. This limits the number of channels that can be transmitting at the same time, since a strong signal from a node located near to the aggregator could cause the SNR of the signal from a distant node to fall below an acceptable level.

The present invention addresses, in particular, the problems of signal detection and reception in this environment. (However, as those skilled in the art will readily appreciate, the present invention can also be applied more widely, in other communications systems).

In the context of the power-line communications system outlined above, the present invention provides methods for mitigating cross-correlation in channelized data transfer using CDMA. The method exploits the fact that the timing of transmission in this environment is known to a relatively high degree of accuracy (compared to most wireless communication systems, for example). The known timing can be used to resolve other ambiguities.

Cross-correlation can increase significantly when multiple channels are transmitted simultaneously since this cross correlation is coherent energy and therefore will potentially appear as a valid signal in other channels. This complicates the process of detecting whether information is from the desired signal, or a cross correlation of data from the other channels.

In the exemplary network described above, the use of CDMA techniques is exploited to provide a mechanism for multiple channels to share a medium simultaneously, to send very short data packets synchronously over a power-line. In this case, each node is allocated a virtual channel over which to transmit, the channel being defined by a particular code-phase window.

In order to achieve efficiency with very low bandwidth and short packets this mechanism avoids the requirement for addressing of packets by using a TDMA/CDMA approach, whereby each node is allocated a time-slot and code-phase with which to communicate. Therefore, the nodes can be distinguished by the time slot and code phase, eliminating the requirement for dynamic arbitration and packet addressing.

To maximise the sensitivity of the receiver, it is desired to set signal-level thresholds as low as possible. However, the disadvantage of setting thresholds very low is that it increases the chance that Gaussian noise will cause signal detection (false positive or false alarm). However, Gaussian noise behaves differently to the cross-correlation products of coherent signals in adjacent channels, since the noise is incoherent.

To mitigate the effects of incoherent noise, each channel is allocated a correlation window (code phase window) and, at each signal detection, the code-phase at which the correlation function has its maximum value is recorded. This phase of the maximum value will be referred to hereinafter as the "peak-phase". This is saved for the next symbol and compared with the peak-phase of the previous symbol. This process is repeated for each received symbol until a completed packet is received.

As the symbols are received they are rejected if the phase difference between two consecutive peaks exceeds a specific threshold—for example ½ chip spacing. As soon as a symbol is discarded the reception of the entire packet is aborted.

For example: for a 31-symbol packet using an 8-chip window (32 taps at ¼ chip spacing), there is a ⅛ probability that the peaks due to Gaussian noise will meet the requirements for 2 consecutive symbols, and therefore a 1 in $2^{96}$ probability of false packet reception (wherein all consecutive symbols meet the phase requirements).

When transmitting a CDMA signal from a node $T_0$ and receiving it at node R the received signal will generally consist of a combination of attenuated signal, reflected signal, and Additive White Gaussian Noise (AWGN). In normal operation, the de-spreading of the signal received at node B has the result of spreading the noise, resulting in a good signal to noise ratio (SNR) for the received signal. This occurs since the AWGN is incoherent with the spreading code, and in such applications it is common practice to measure the received signal power in order to compute a detection threshold for the desired signal.

In a shared channel where multiple nodes, $T_{0 \ldots N}$, are transmitting, all using the same carrier frequency, the received signal contains multiple signals which may be coherent to the desired signal at the receiver, in addition to the AWGN. In these situations, the de-spreading code will not sufficiently spread the energy from the additional received signals making such thresholding difficult or impossible to achieve. This problem becomes worse when all of the nodes $T_{0 \ldots N}$ are using phase shifted versions of the same spreading code—in this case the coherent energy from these additional signals will cause cross correlation in the output of the de-spreading circuit (correlator) which will be orders of magnitude greater than the energy received from the AWGN. In this case, an alternative method for reliable signal detection is required which is immune to both the AWGN and coherent energy.

Considering the case of modulated signals from $T_{0 \ldots N}$ where we wish to receive $T_x$ ($0<=x<=N$), then at the output of the correlator we will have the sum of N+1 signals including the AWGN energy. The signals are generally modulated with a further (data) signal which will normally be uncorrelated with the spreading code since it carries data unique to each node. The cross correlation from these signals may be from 0 to N times the cross correlation product of a single node. When 0, the AWGN energy will dominate.

In addition to the thresholding of a received signal, the system also has to accommodate the case where there are no signals transmitted by any node and in this case the AWGN energy will dominate the output of the correlator.

In particular, in the protocol of the present example, it was desired to operate without any of the traditional training sequences, in order to improve the efficiency of the communications. Consequently, there is no training period during which a receiver can 'lock' on to a signal and set thresholds prior to trying to de-modulate the signal. It is therefore necessary to consider each correlation output independently of any previous received signal level and determine if the appropriate node is transmitting—and, if so, what data it is sending.

In order to ensure reliable communications, an alternative signal detection strategy is desired in which a signal can be received in real time, de-spread and speculatively de-modulated before it becomes possible to determine any receive-thresholds for a particular channel, or the nature of the energy received from the medium. In order to meet this need, the detection mechanism must accommodate a very wide dynamic SNR range.

In the present embodiment, a two-step strategy is employed which treats the AWGN and Coherent noise components separately.

The present inventors have recognised that, since AWGN is incoherent to the spreading code, it will generate energy peaks at different code phases for each separate correlation. This can be exploited by using the phase of the energy peak and considering the phase variations between symbols. These variations can be expected to be much higher for noise (alone) than the phase variations induced by noise in a real signal. Hence, when there is no energy being transmitted by any active node the AWGN will dominate and can be easily rejected by a simple comparison of the phase of the energy peak between each symbol.

After rejecting detection of noise on an inactive channel the system is left with the more difficult task of rejecting cross-correlation components of other coherent signals modulated with a different phase of the spreading code.

Since the number of nodes transmitting in any time slot may vary significantly with each time slot and nodes will only send data when they are active, it is desirable to provide a mechanism to distinguish between valid packets transmitted by an active node and phantom packets received when a node is inactive, due to cross correlation with the signal from an active node.

In these cases, when the desired node is not transmitting, the cross correlations will generally cause an energy peak with a fixed phase relationship between each transmitted symbol, or at least a significantly smaller phase-shift between symbols. Such a signal will be de-modulated as a weak signal which will have the correct carrier phase rotation between each symbol. It will therefore appear to be a valid packet.

In many conventional networks this would lead to a packet being received and decoded as a valid packet, but then being rejected due to the address not matching the receiver's expectations. However, in the present example, no addressing information is included in the packet (in order to increase efficiency), so a packet resulting from cross correlation is indistinguishable from a valid packet.

In the present embodiment, the addressing information is excluded from the packets in order to keep the packets short due to the low bandwidth of the channel and the desire for maximum simultaneous throughput from the maximum number of nodes. As explained above, addressing information is implied instead by the time and phase of transmission of a signal.

To resolve the problem of coherent interference in these circumstances, the Cyclic Redundancy Check (CRC) is exploited, to distinguish between valid packets and those "phantom" (or "ghost") packets that are received due to cross-correlation. The CRC is modified so that it is specific and different for each phase-window at the receiver. In the present embodiment, this is achieved by the addition of a different constant to the CRC for each window. That is, a unique number is added to the CRC check-bits by each concurrently transmitting transmitter. The transmitting node knows which number to use because each is associated with the code-phase offset assigned to the node.

In this case, when a phantom packet is received, it is guaranteed that there is only a single phase window in which the packet can pass the CRC check. Phantom packets received by mistake are therefore rejected, because the CRC will fail. A phantom packet may be received on multiple channels, but it will be rejected for all but the intended channel, because only for this channel will the CRC be successfully validated. This approach sacrifices a small amount of the error protection offered by the CRC, in return for a convenient way to distinguish interfering or phantom packets from a valid packet of interest. This mechanism allows for the SNR thresholds to be set very low (or completely disregarded) ensuring the best sensitivity is achieved.

Figure 2:
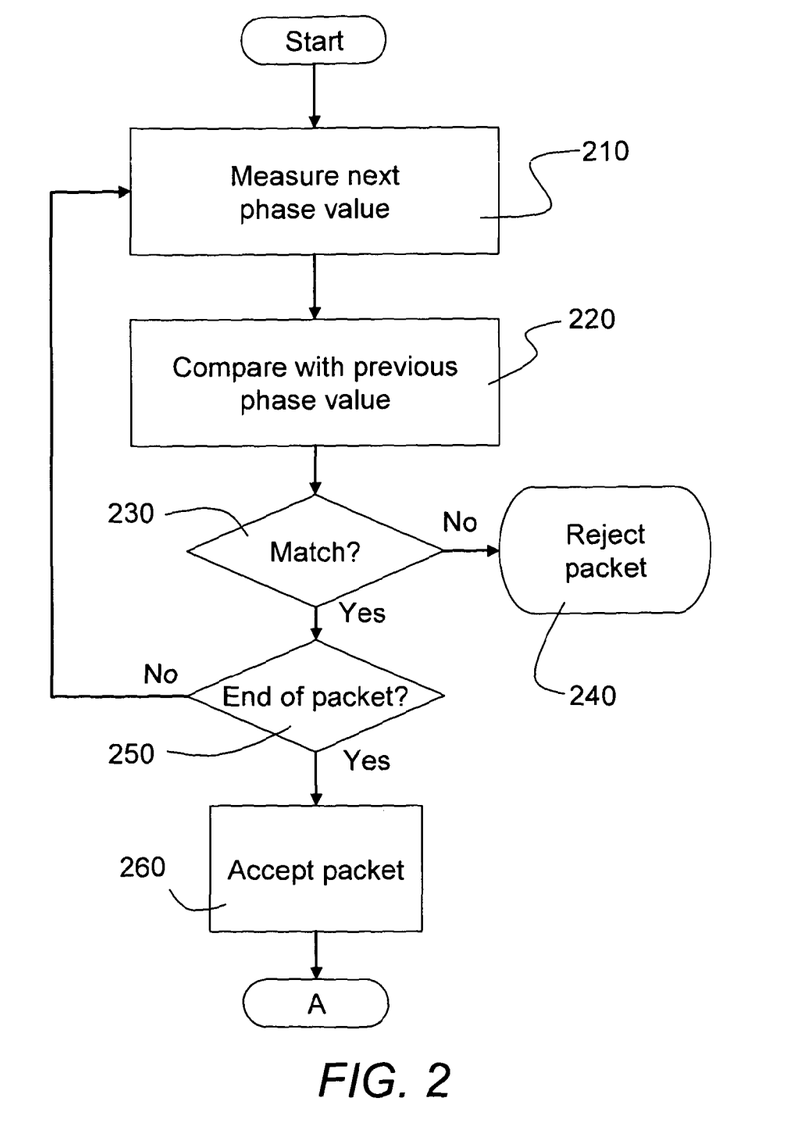
FIG. 2 is a flowchart illustrating a method of detecting a signal according to an embodiment of the invention.
Figure 3:
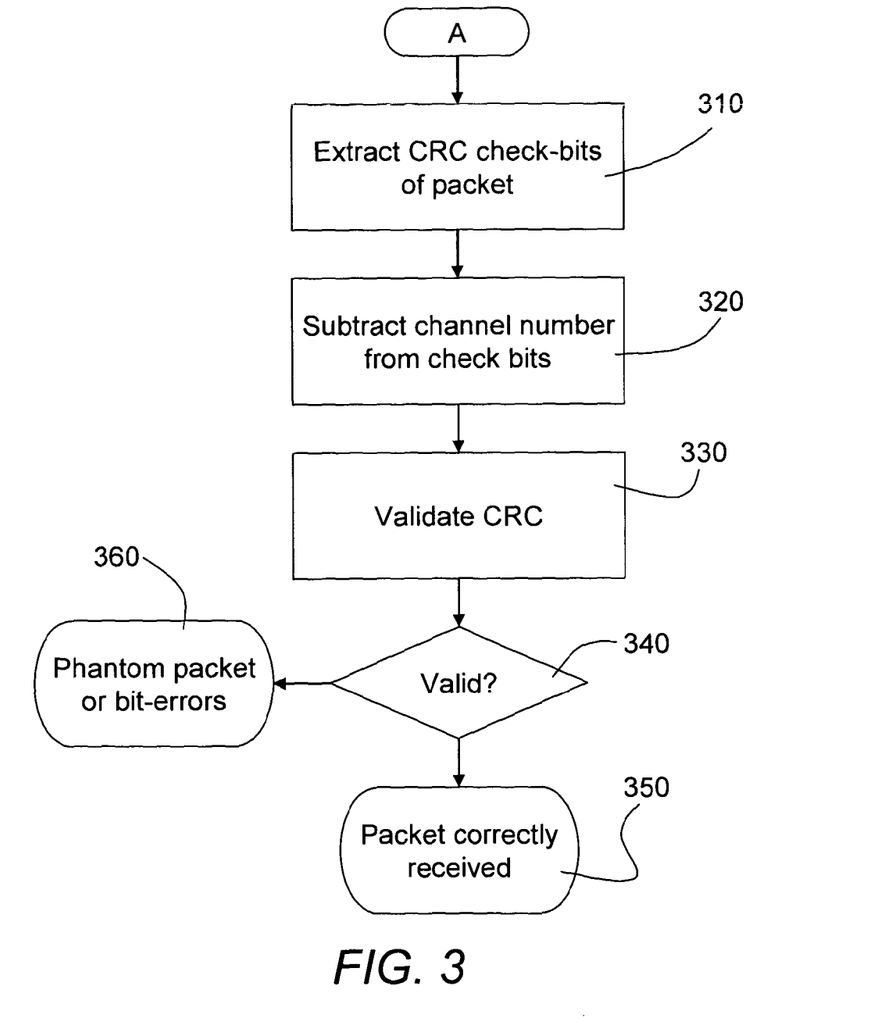
FIG. 3 is a flow chart of a further portion of the method of FIG. 2.

FIGS. 2-3 illustrate a method of signal detection according to an embodiment. A block diagram of a corresponding receiver operating according to the method is shown in FIG. 4.

In step 210 of FIG. 2, the method measures the code-phase (peak phase) of the received signal, within a current time-window which corresponds to the expected time of arrival of a symbol. In step 220, the code-phase of the current symbol is compared with the stored value of peak phase that was measured for the previous symbol. In step 230, if the difference between the two peak phase values is less than half a chip (a chip being one bit of the spreading code), then the two symbols are deemed to match, and the method proceeds to step 250, where it is determined whether the entire packet has been processed. If not, the method returns to step 210, to examine the next symbol. If, in step 230, the difference between the phase values is greater than or equal to half a chip, the packet is rejected 240. When the entire packet has been received without any symbol being rejected, the packet is accepted 260. The method has now determined that there is a valid transmission present in the received signal; however, it is not known whether this is the desired transmission expected on this channel, or a result of cross-correlation (interference) with another channel.

The method proceeds to step 310 of FIG. 3. The CRC check-bits are extracted 310 from the message and CRC is decremented by the channel number. Here, the channel number is used as a unique modifier that is added to the CRC check-bits by the transmitter, prior to transmission in the relevant channel. After the modifier has been removed (subtracted) the next step is CRC verification 330 with the normal polynomial. If CRC validation is successful 340, then the correct signal has been received 350 without error. If the validation fails 340, there are two possible explanations 360. One is that the received packet is a ghost—it actually belongs to another channel having a different code-phase and channel number, but has been erroneously detected in the present channel because of the cross-correlation effect. In this case, the CRC check-bits will have been incremented by one number at the transmitter and then decremented by a different number at the receiver, because the channel numbers are not the same. The other possibility is that the receiver is receiving the desired channel (that is, the channel with the expected code-phase), but bit errors have been introduced in the signal by noise. In either case, the packet is rejected and/or ignored.

Figure 4:
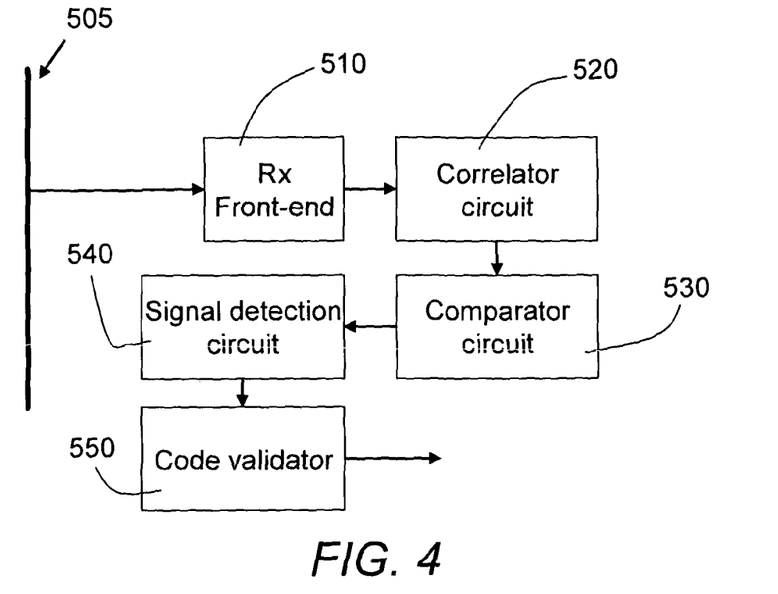
FIG. 4 is a simplified block diagram of a receiver adapted to carry out the method of FIGS. 2-3.

In the receiver of FIG. 4, the power-line medium 505 is interfaced to a receiver front-end 510. The front-end 510 delivers received signals to a correlator circuit 520 which performs the phase measurement of step 210. Comparator 530 performs comparison 220. Signal detection circuit evaluates 230 whether the phases match, in order to decide whether or not to accept 260 the packet as a valid transmission.

Once a packet has been detected 260, code validator 550 performs the necessary CRC adjustment 310, 320 and validation 330, to decide 340 whether the packet has been received in the right (code-phase) channel.

Figure 5:
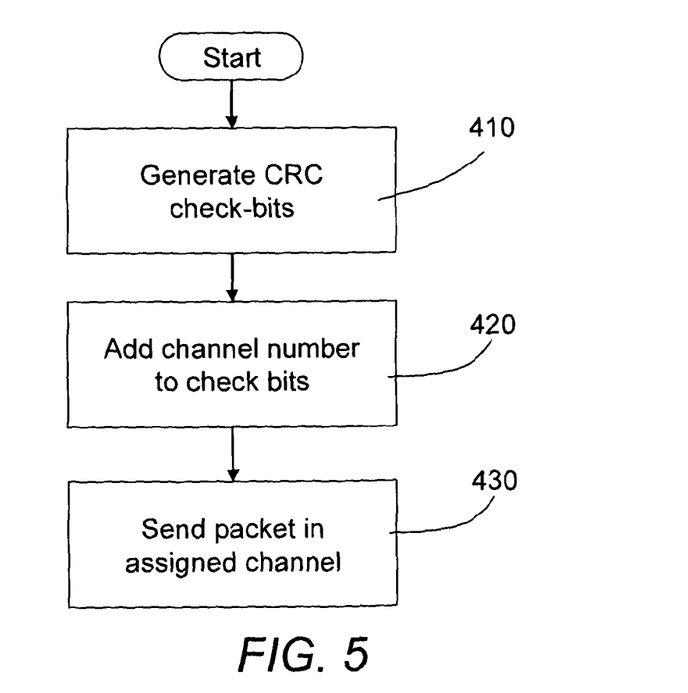
FIG. 5 is a flowchart showing a method of transmitting a signal suitable for reception by the receiver and method of FIGS. 2-4.

FIG. 5 shows a corresponding method of transmitting a signal suitable for the receiver of FIG. 4. CRC check-bits are generated 410 (which may be done using a standard CRC algorithm and common generator polynomial). To the binary word consisting of these check-bits, the channel number is added 420. The modified check-bits are then appended to the message and transmitted 430 in the assigned channel (that is, the channel with the appropriate code-phase).

Figure 6:
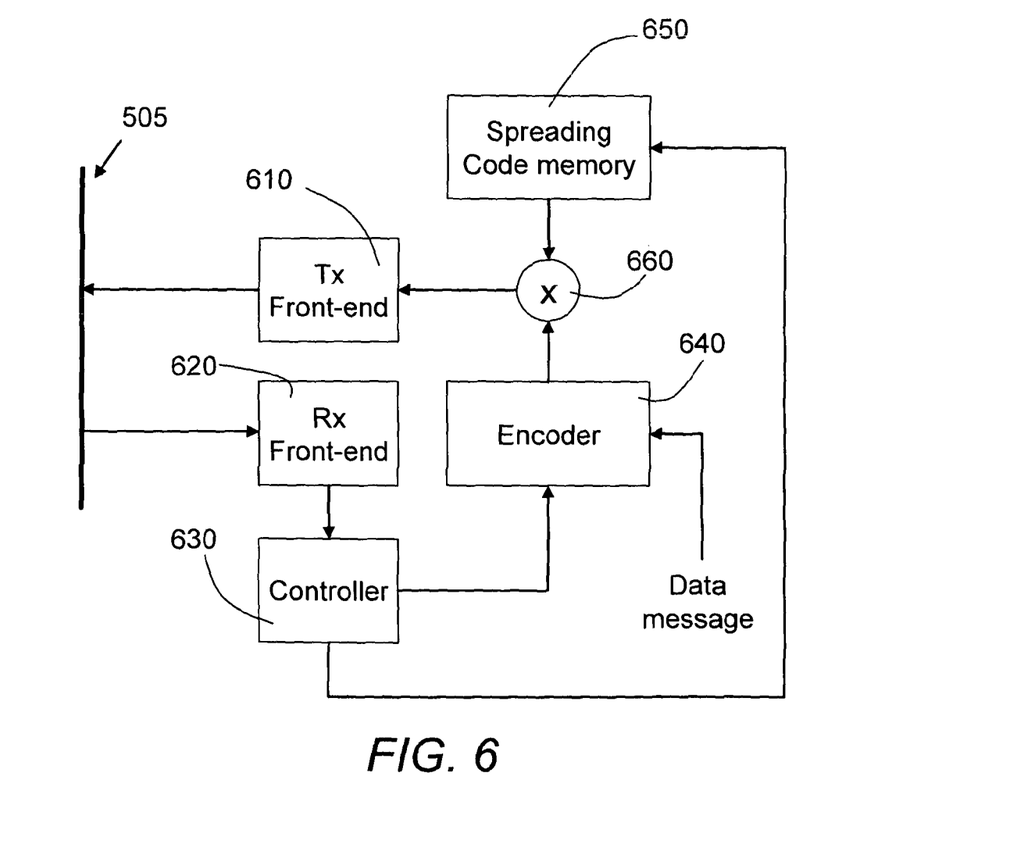
FIG. 6 is a block diagram of a transmitter for implementing the method of FIG. 5.

FIG. 6 shows a simplified block diagram of a transmitter for carrying out the method of FIG. 5. A transmitter front-end 610 is connected to the power-line medium 505, for transmitting signals. A receiver front-end 620 is also connected to the medium. This enables the device to receive configuration instructions—in particular, configuring the channel that the device is to use. A controller 630 configures the transmitter, based on the instructions received over the power-line 505. The controller 630 controls the encoder 640 to use the modified version of CRC which corresponds to the channel number. It also controls the spreading code memory 650 to output the chips of the spreading code with the correct code-phase for the assigned channel. Encoder 640 receives the data message to be transmitted; generates 410 CRC check-bits; adds 420 the appropriate channel number, based on the input from the controller 630 and output the entire message to modulator 660. Here, the message is modulated with the spreading code from the memory 650. The modulated data message is transmitted by the transmitter front-end 610.

FIGS. 7-12 show plots illustrating the effects of noise and cross correlation. The x-axis is code-phase; the y-axis is symbol index; and the z-axis is correlation amplitude (energy).

Figure 7:
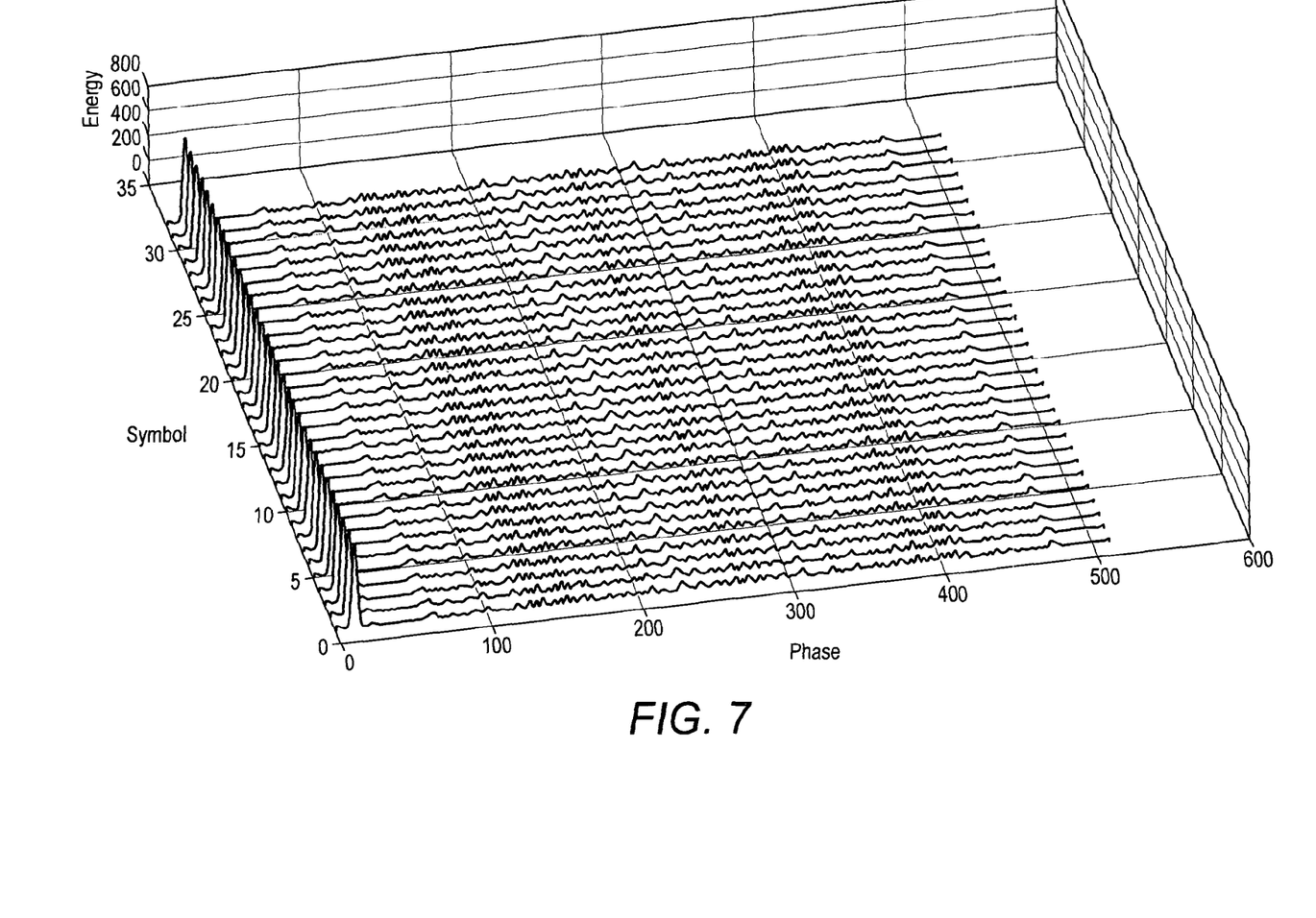
FIG. 7 shows a plot of correlation strength for a received signal, over a range of symbols and code-phases.

FIG. 7 shows the full correlation over all code phases for a signal in the absence of noise. The cross correlation is clearly visible and the peak energy is in channel 1. From this it is apparent that the cross correlation occurs always at the same place in the other channels.

Figure 8:
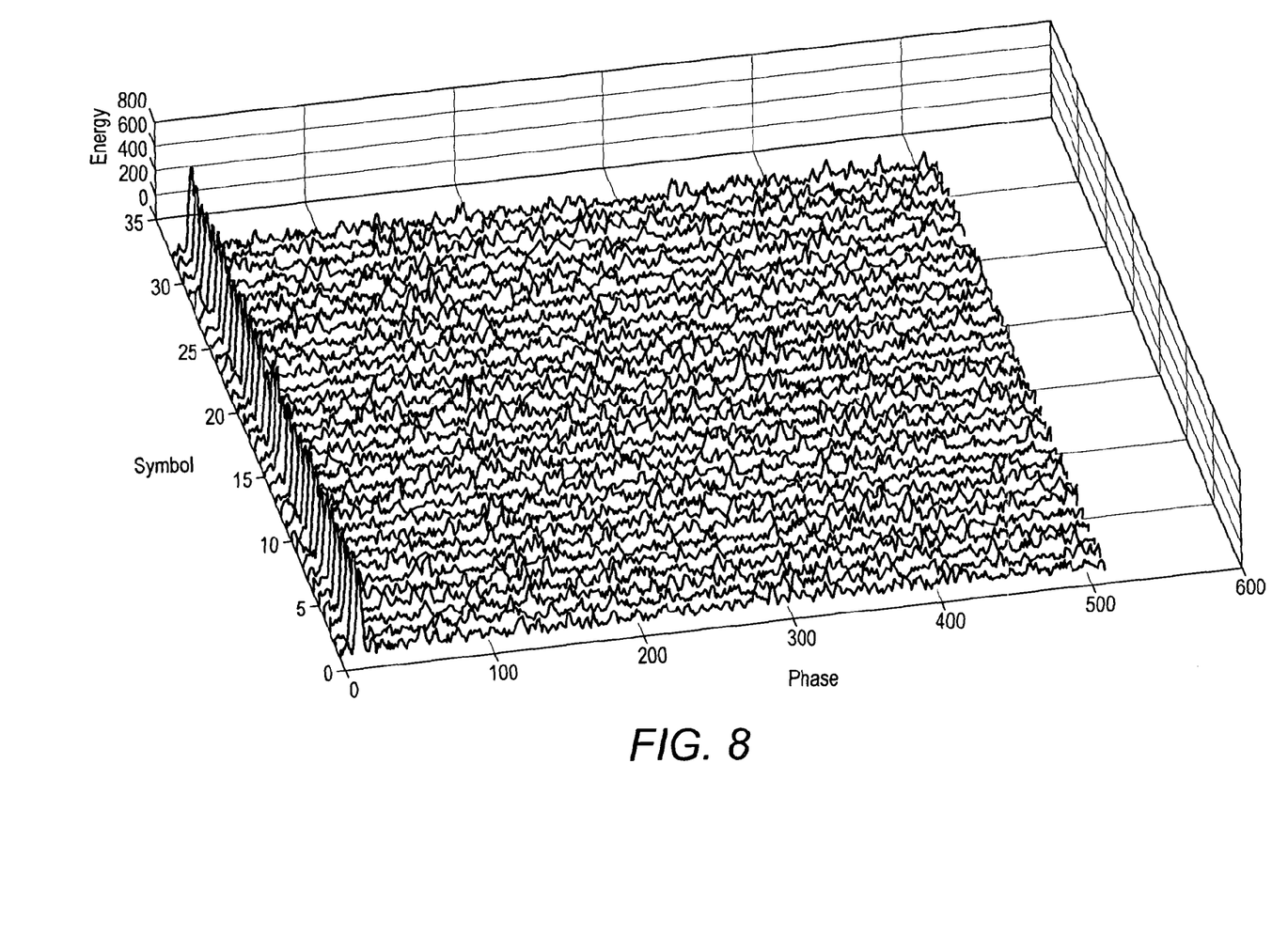
FIG. 8 is a plot corresponding to the signal of FIG. 7 in noise.

FIG. 8 shows the same correlation, but with strong noise present. Once again, the signal clearly can be demodulated, but the noise dominates the energy in the other channels.

Figure 9:
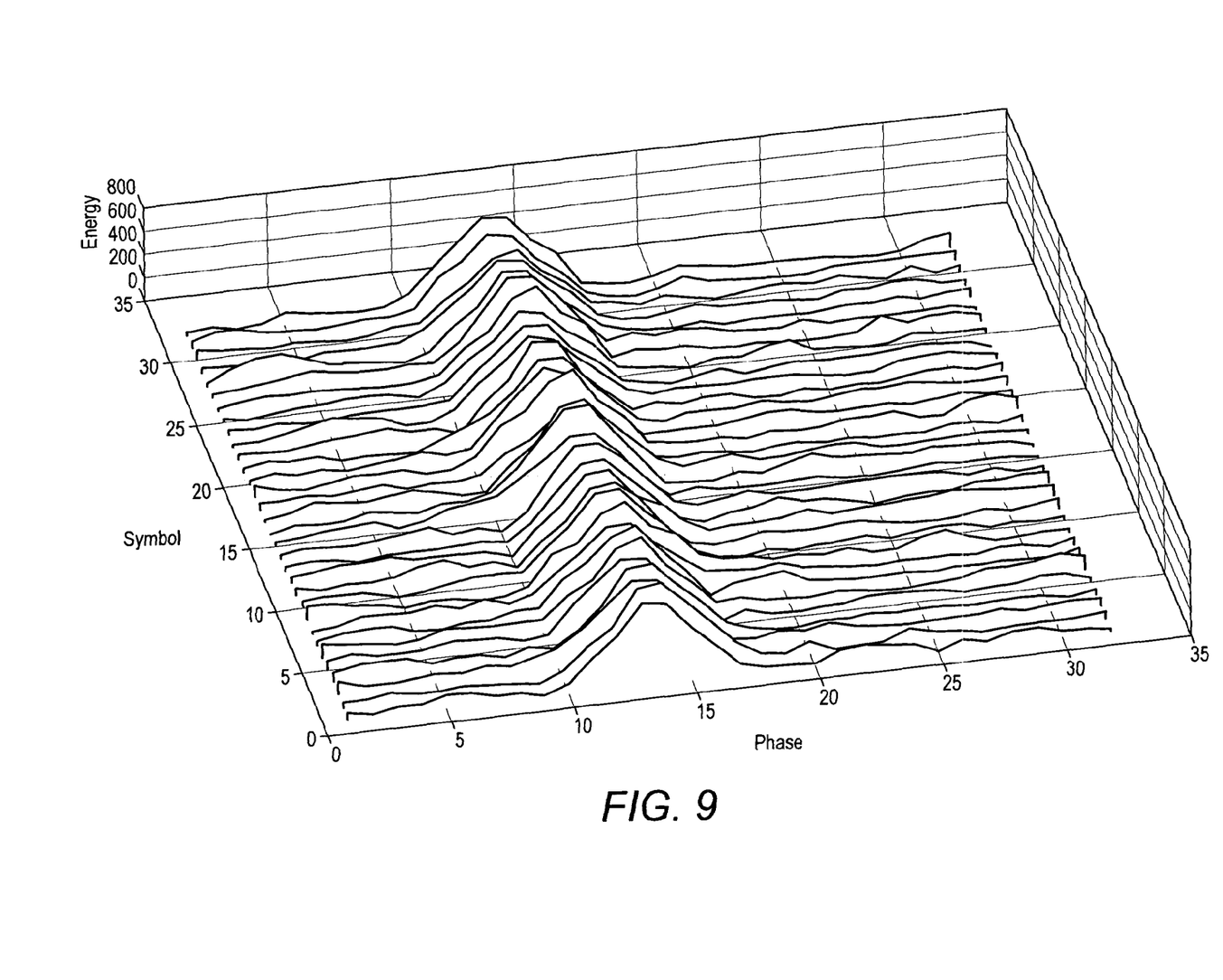
FIG. 9 is an enlarged view of part of the signal of FIG. 8, showing a correlation peak at approximately the same code phase for each symbol.

FIG. 9 is an enlarged view of the AWGN+Signal, for channel 1. This shows that the peak phase is affected by the noise but the peak remains within a narrow window of code-phases.

Figure 10:
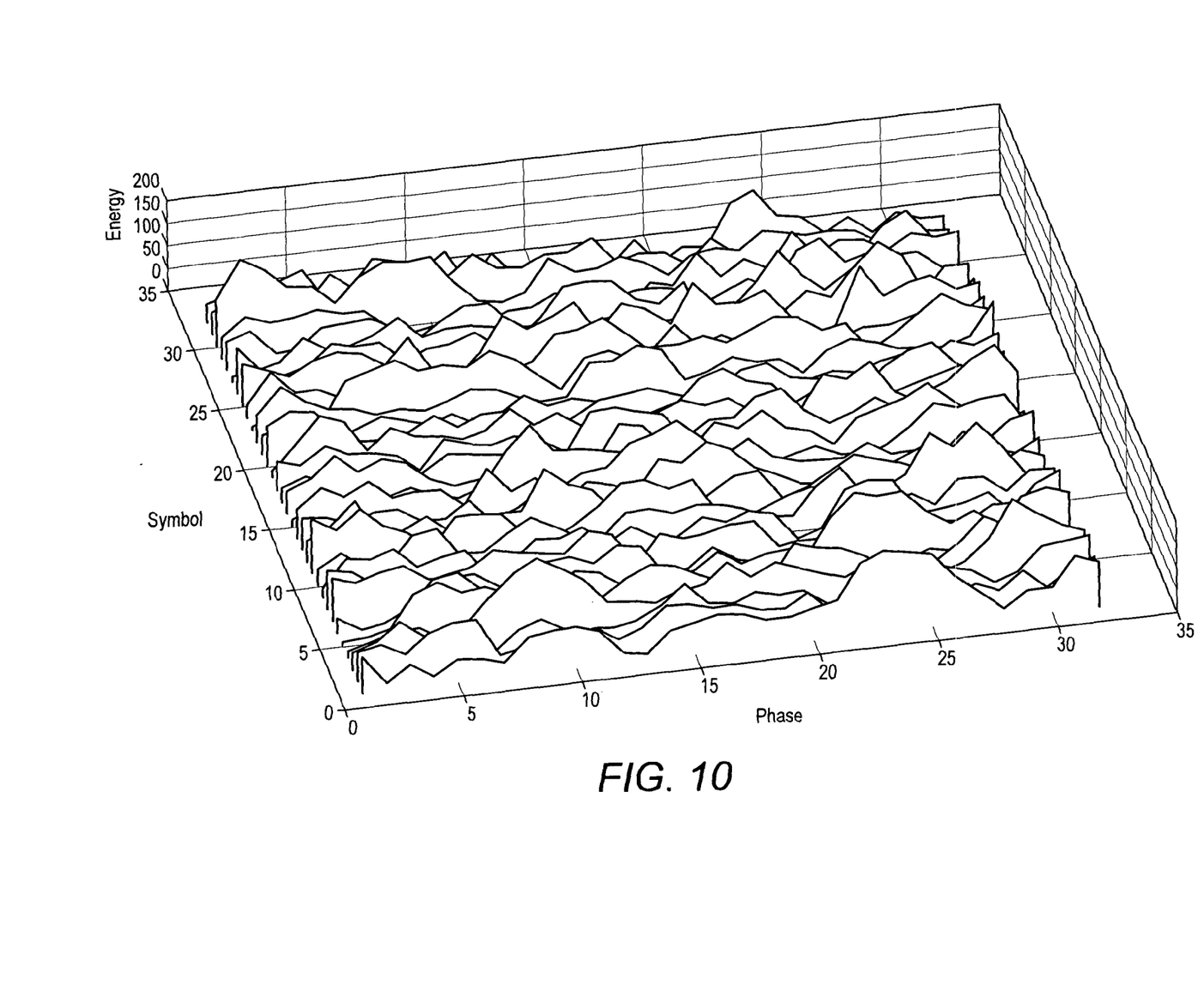
FIG. 10 is an enlarged view of a different part of FIG. 8, showing the correlation of noise.

FIG. 10 is an enlarged view of the AWGN+signal, for channel 2. (Note that the scale on the z-axis is also four times enlarged in this plot.) Here, the cross correlation is masked by the noise, but in this case the peak energy varies randomly across the whole window. Comparison of the peak phases for the different symbols will therefore discard the signal because channel 2 is inactive.

Figure 11:
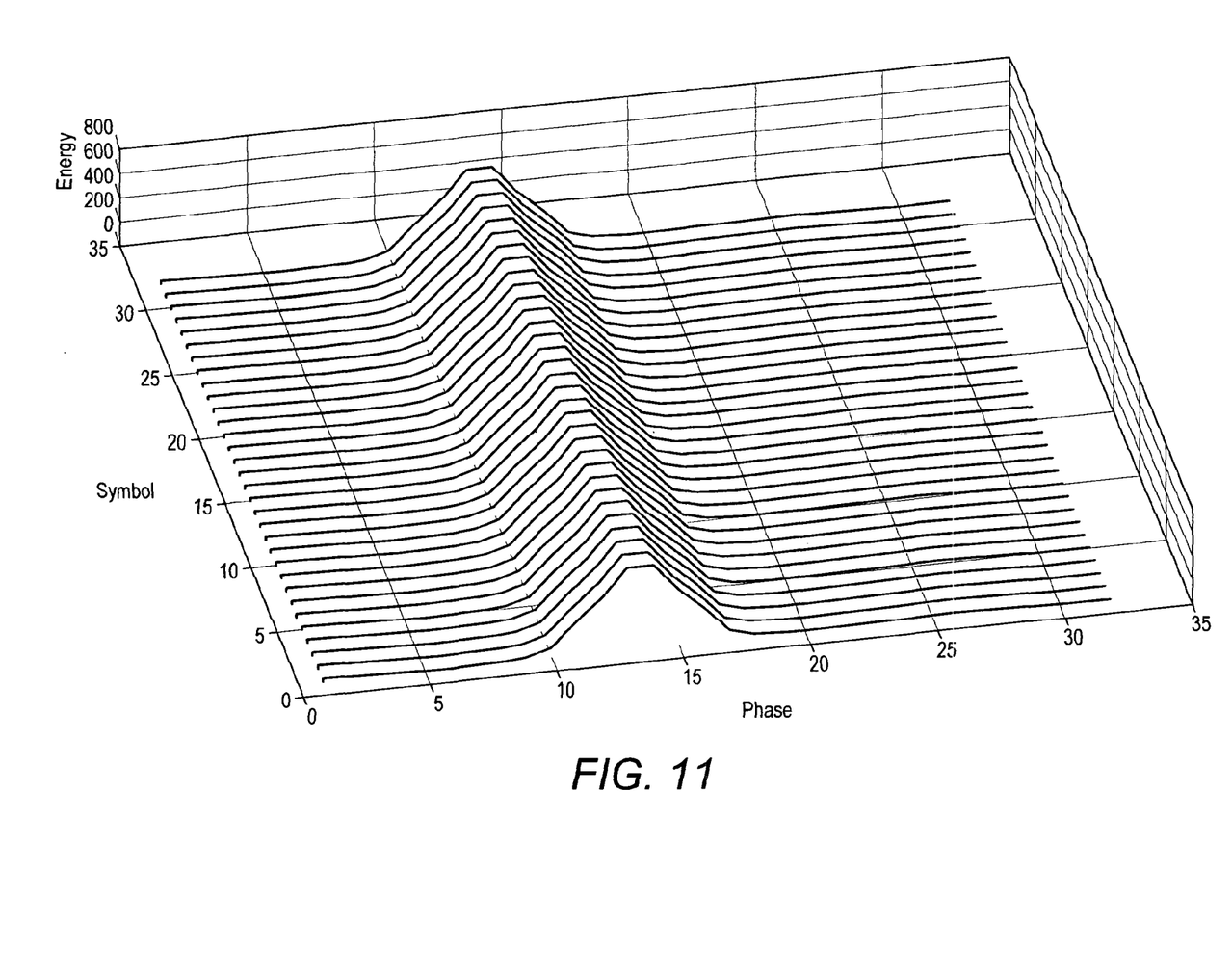
FIG. 11 is an enlarged view showing the correlation of a perfect signal.

FIG. 11 is an enlarged view of the signal only, for channel 1. This is a perfect channel and the signal is easily demodulated.

Figure 12:
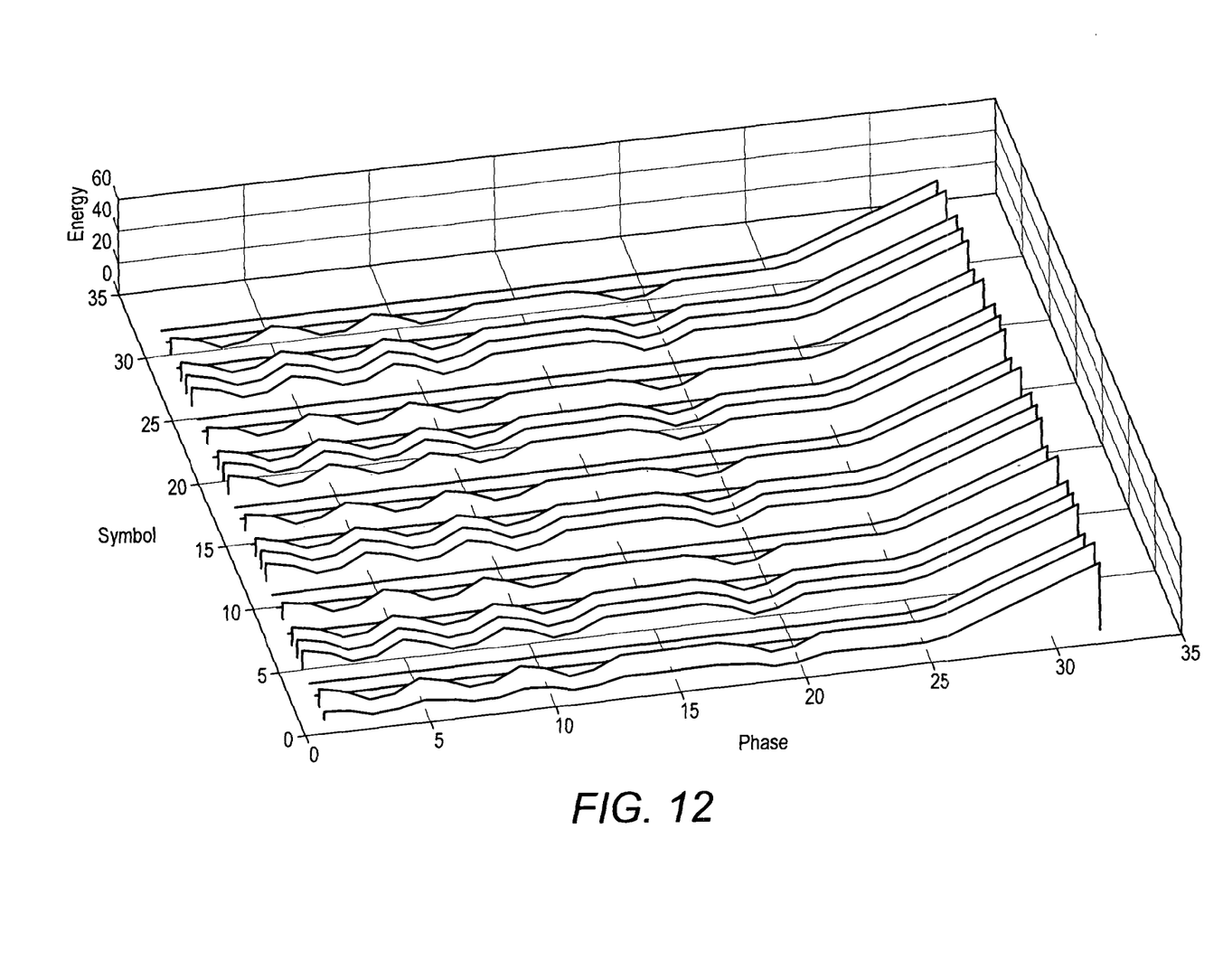
FIG. 12 is an enlarged view showing the effect of cross-correlation of a perfect signal on an adjacent channel.

FIG. 12 is an enlarged view of the signal only, for channel 2. (Note that the scale of the z-axis is enlarged by a factor of more than 10, compared with FIG. 11.) The peak in this case is a cross-correlation from channel 1 and would pass the peak phase comparison test and be demodulated. Nevertheless, the CRC validation would then fail, because channel 2 would have a different valid CRC for the same packet data.

While the invention has been illustrated and described in detail in the drawings and foregoing description, such illustration and description are to be considered illustrative or exemplary and not restrictive; the invention is not limited to the disclosed embodiments.

For example, in the embodiments described above, a unique error-detecting code is implemented by adding a unique number to the check-bits generated by a generic error-detecting code. Those skilled in the art will appreciate that a generic error detecting code could also be customized in other ways, to make it suitable for use in an embodiment. For example, other algebraic or combinatorial operations such as a logical exclusive OR (XOR) could be applied.

In the embodiments described above, each symbol of the data message is modulated on a single repetition of the spreading code. That is, the symbol period is equal to one code epoch. Those skilled in the art will appreciate that this is not essential. In other embodiments, for example, the duration of each symbol may be a multiple of the code epoch. Note however that this may reduce the sensitivity of the transmission detection method, because the correlation properties of several repetitions of a shorter PN code will generally not be as good as those of a single instance of a longer PN code providing the same number of chips.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of detecting a transmission, the method comprising:
    measuring, from a first portion of a received spread-spectrum signal, a first code-phase of a spreading-code;
    measuring, from a second portion of the signal, a second code-phase of the spreading-code;
    comparing the first and second code-phases; and
    detecting whether the transmission is present according to a result of the comparison;
    wherein the step of detecting whether the transmission is present comprises determining whether the first and second code-phases match one another, the code-phases preferably being determined to match if a difference between them is less than a predefined threshold.

2. The method of claim 1 wherein, in the step of detecting whether the transmission is present, the signal is rejected if the result of the comparison shows that the first and second code-phases do not satisfy a predefined relationship.

3. The method of claim 1, wherein:
the transmission comprises a sequence of symbols;
the first portion of the signal corresponds to a first one of the symbols; and
the second portion of the signal corresponds to a second different symbol.

4. The method of claim 1, further comprising determining whether the detected transmission is a desired one among a plurality of signals, wherein each of the plurality of signals comprises a message encoded with a specific, different error-detecting code, the method comprising, upon detecting that the transmission is present:
attempting to validate the message using the specific code associated with the desired signal; and
determining that the detected transmission is the desired one if the validation is successful.

5. The method of claim 4, wherein each error-detecting code defines a plurality of check bits in the message, the specific code for each signal being defined by a specific number with which the message is modified before the signal is transmitted, and
wherein the step of attempting to validate the message comprises:
inversely modifying the message with the specific number associated with the desired signal;
extracting the plurality of check bits; and
validating the check bits, according to the error-correcting or error-detecting code.

6. The method of claim 4, wherein the error-detecting code comprises a Cyclic Redundancy Check, CRC.

7. A non-transitory computer readable medium having embodied thereon a computer program comprising computer program code means adapted, when run on a computer, to perform the steps of:
measuring, from a first portion of a received spread-spectrum signal, a first code-phase of a spreading-code;
measuring, from a second portion of the signal, a second code-phase of the spreading-code;
comparing the first and second code-phases; and
detecting whether the transmission is present according to a result of the comparison;
wherein the step of detecting whether the transmission is present comprises determining whether the first and second code-phases match one another, the code-phases preferably being determined to match if a difference between them is less than a predefined threshold.

8. A receiver operable to detect a transmission comprising a spread-spectrum signal, the receiver comprising:
a correlator, adapted to measure a first code-phase of a spreading-code of a first portion of a received signal;
a correlator, adapted to measure a second code-phase of a spreading-code of a second portion of the signal;
a comparator, adapted to compare the first and second code-phases; and
a detector, operable to detect whether the transmission is present according to a result of the comparison;
wherein the detector detects whether the transmission is present comprises determining whether the first and second code-phases match one another, the code-phases preferably being determined to match if a difference between them is less than a predefined threshold.

9. The receiver of claim 8, further comprising:
a decoder, operable to determine whether the detected transmission is a desired one among a plurality of signals, wherein each of the plurality of signals comprises a message encoded with a specific, different error-detecting code, the decoder comprising
a code validator, adapted to:
attempt to validate the message using the specific code associated with the desired signal; and
determine that the detected transmission is the desired one if the validation is successful.

10. The receiver as claimed in claim 8, adapted to communicate over a power-line communications network.

11. The receiver as claimed in claim 10, adapted to determine a timing or code-phase of a received symbol relative to a timing-reference signal broadcast in the power-line communications network.

* * * * *